United States Patent
Ho

(10) Patent No.: US 10,809,629 B2
(45) Date of Patent: Oct. 20, 2020

(54) METHOD AND APPARATUS FOR COMPUTING FEATURE KERNELS FOR OPTICAL MODEL SIMULATION

(71) Applicant: Taiwan Semiconductor Manufacturing Co., Ltd., Hsinchu (TW)

(72) Inventor: Kenneth Lik Kin Ho, San Francisco, CA (US)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/423,190

(22) Filed: May 28, 2019

(65) Prior Publication Data

US 2020/0073249 A1    Mar. 5, 2020

Related U.S. Application Data

(60) Provisional application No. 62/725,271, filed on Aug. 31, 2018.

(51) Int. Cl.
G03F 7/20 (2006.01)
G06F 17/14 (2006.01)
G06F 17/16 (2006.01)
G06F 30/20 (2020.01)

(52) U.S. Cl.
CPC ............ G03F 7/705 (2013.01); G06F 17/142 (2013.01); G06F 17/16 (2013.01); G06F 30/20 (2020.01)

(58) Field of Classification Search
CPC .................. G03F 7/705; G06F 30/20
USPC ........................................................ 716/54
See application file for complete search history.

(56) References Cited

U.S. PATENT DOCUMENTS

| | | | |
|---|---|---|---|
| 2003/0103189 A1* | 6/2003 | Neureuther | G03F 7/706 351/159.74 |
| 2005/0015233 A1* | 1/2005 | Gordon | G03F 1/36 703/13 |
| 2005/0185159 A1* | 8/2005 | Rosenbluth | G03F 7/70441 355/53 |
| 2006/0115162 A1* | 6/2006 | Hwang | G06K 9/00288 382/205 |
| 2007/0086655 A1* | 4/2007 | Simard | G06K 9/4628 382/190 |
| 2008/0219590 A1* | 9/2008 | Li | G02B 27/0012 382/279 |
| 2011/0113390 A1* | 5/2011 | Cao | G03F 7/70666 716/55 |

(Continued)

*Primary Examiner* — Suchin Parihar
(74) *Attorney, Agent, or Firm* — JCIPRNET

(57) ABSTRACT

A method and an apparatus for computing feature kernels for optical model simulation are provided. In the method, a feature matrix mathematically describing a plurality of properties of an optical imaging system is identified. A sampling matrix comprising at least one vector serving as input to form a low-rank basis for the feature matrix is generated. The sampling matrix is iteratively multiplied by the feature matrix and a multiplication result is adaptively rescaled according to numerical stability until a convergence condition is met. The iteration results are used to form a reduced feature matrix. Decomposition values of the reduced feature matrix are computed and a plurality of feature kernels are extracted from the computed decomposition values.

20 Claims, 5 Drawing Sheets

(56) References Cited

U.S. PATENT DOCUMENTS

| | | | |
|---|---|---|---|
| 2011/0222739 A1* | 9/2011 | Zhou | G03F 7/705 382/112 |
| 2014/0282298 A1* | 9/2014 | Fan | G06F 30/398 716/53 |
| 2018/0113840 A1* | 4/2018 | Li | G06F 15/80 |
| 2019/0122111 A1* | 4/2019 | Min | G06N 3/0481 |

* cited by examiner

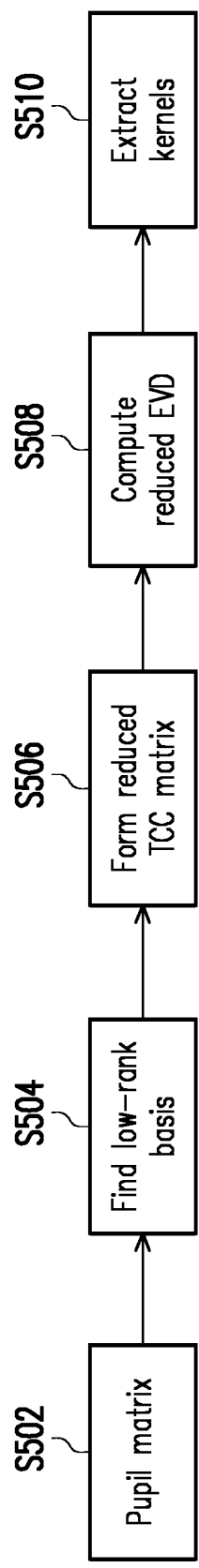
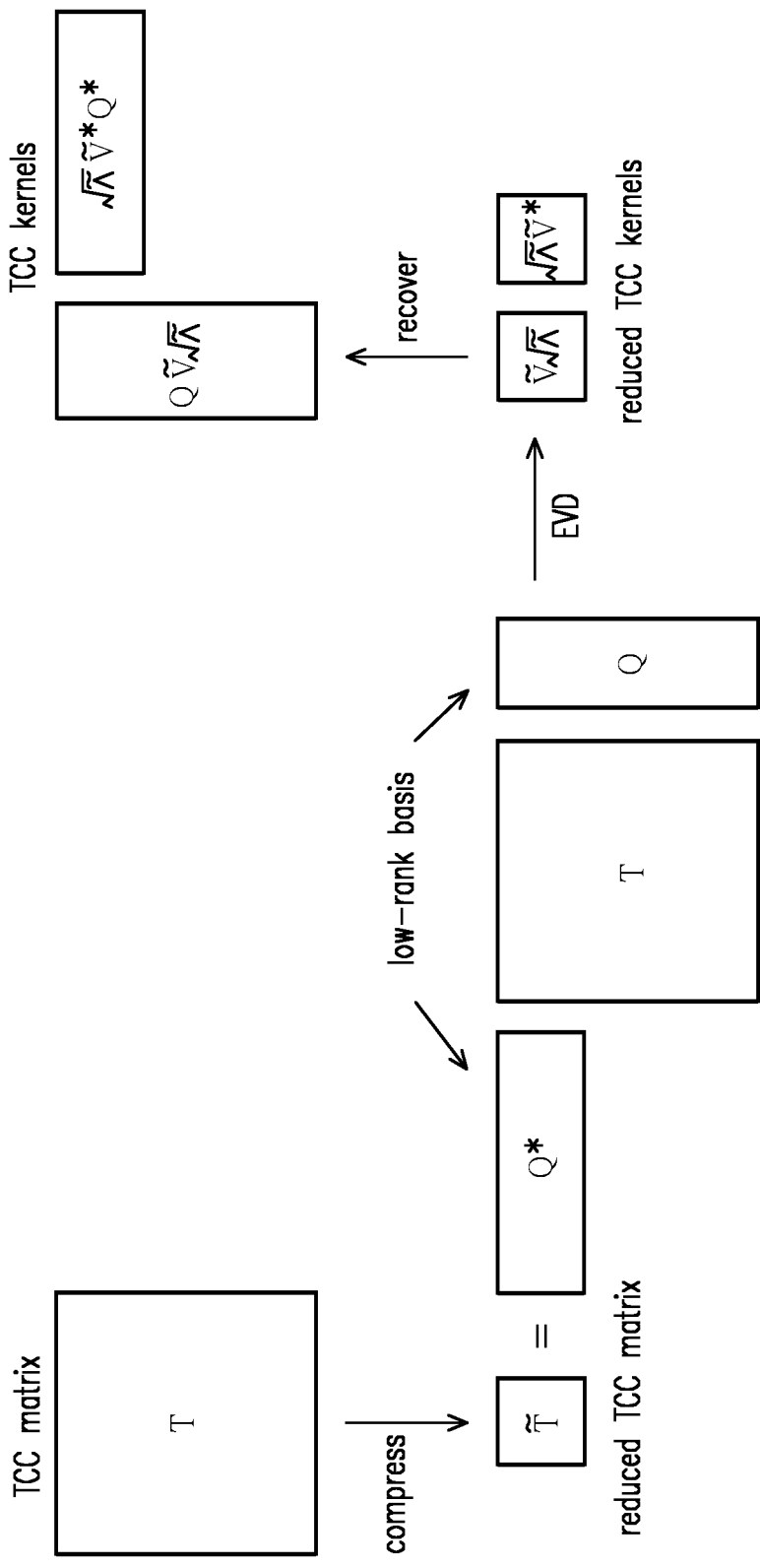
FIG. 5A
FIG. 5B

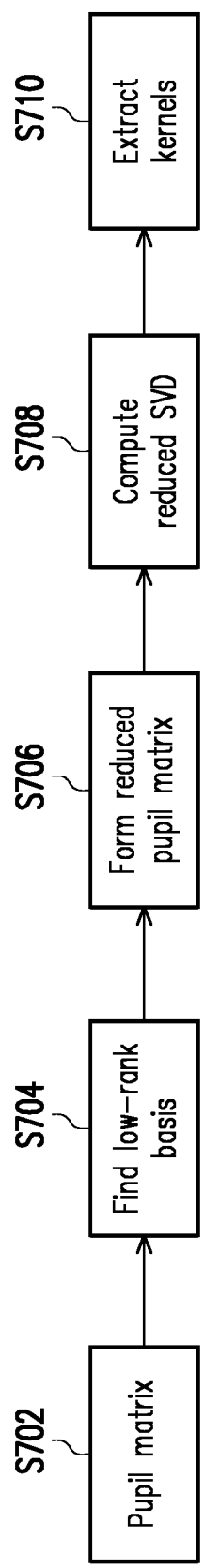
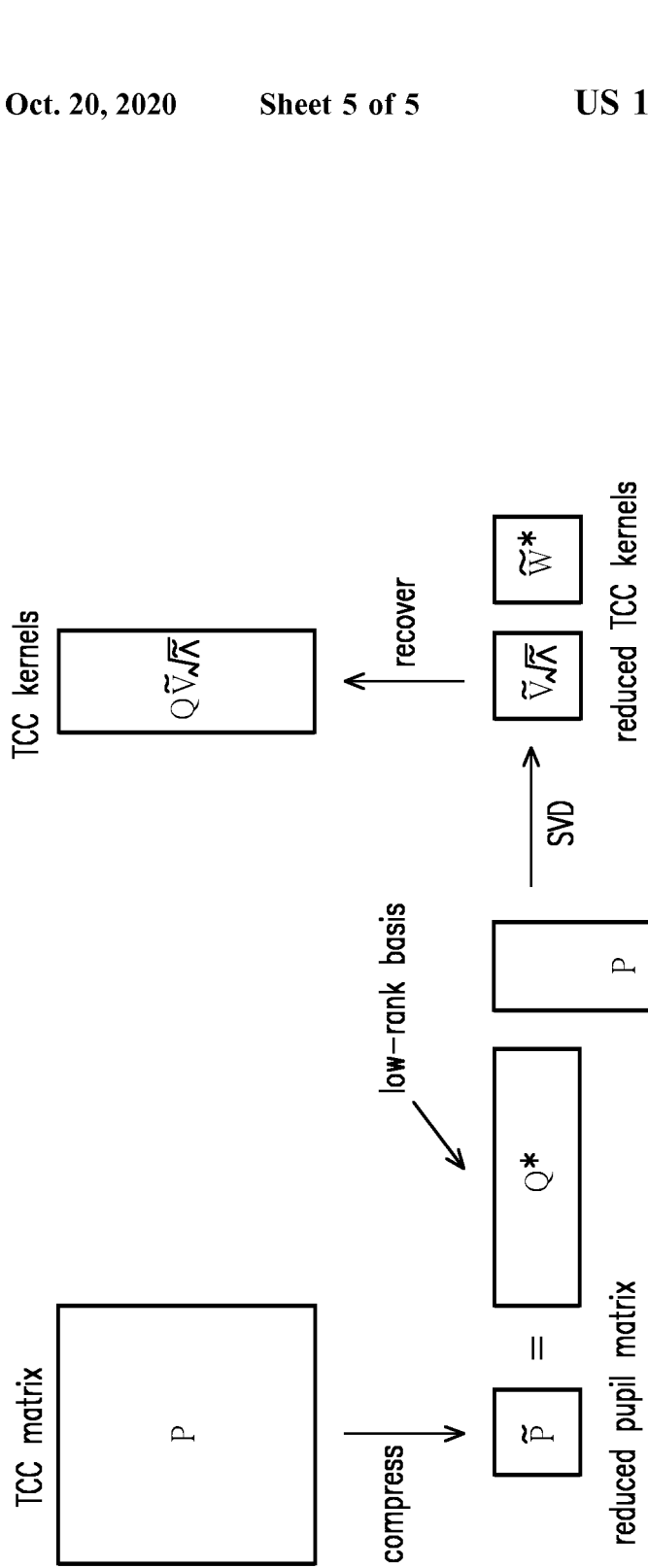
FIG. 7A
FIG. 7B

METHOD AND APPARATUS FOR COMPUTING FEATURE KERNELS FOR OPTICAL MODEL SIMULATION

CROSS REFERENCE TO RELATED APPLICATION

This application claims the priority benefit of U.S. provisional application Ser. No. 62/725,271, filed on Aug. 31, 2018. The entirety of the above-mentioned patent application is hereby incorporated by reference herein and made a part of specification.

BACKGROUND

In the manufacturing processes of modern semiconductor devices, various materials and machines are manipulated to create a final product. Due to the increasing complexity of semiconductor devices and the development of ultra-small transistors, the variation in the process has a greater impact on the performance of the product. Lithography is one of the key factors that cause the impact and lithographic simulations are applied to estimate the performance of the product to be manufactured before mass production.

A transmission cross-coefficient (TCC) matrix that mathematically describes properties of an optical imaging system under Hopkins theory is adopted in lithographic simulations, and computation of TCC kernels from the TCC matrix is essential to the simulations. Standard methods for computing the TCC kernels, however, are very computationally expensive, which may slow down the simulations and increase an overall time of mask making process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5A is a flowchart illustrating a method for computing feature kernels for optical model simulation by using EVD algorithm according to an embodiment of the disclosure.

FIG. 5B is a schematic diagram illustrating an example of computing feature kernels for optical model simulation by using EVD algorithm according to an embodiment of the disclosure.

FIG. 7A is a flowchart illustrating a method for computing feature kernels for optical model simulation by using SVD algorithm according to an embodiment of the disclosure.

FIG. 7B is a schematic diagram illustrating an example of computing feature kernels for optical model simulation by using SVD algorithm according to an embodiment of the disclosure.

DESCRIPTION OF THE EMBODIMENTS

Figure 1:
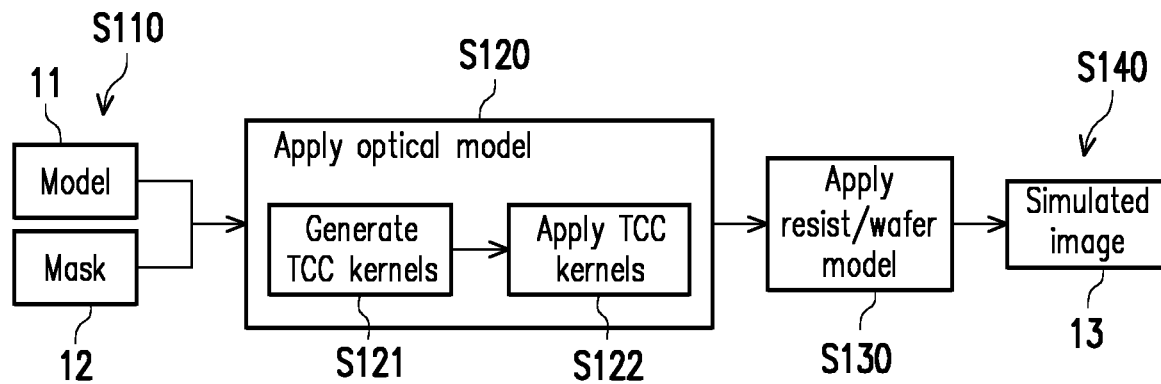
FIG. 1 is a schematic diagram illustrating a model simulation process according to an embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

This invention aims to dramatically accelerate the computation of transmission cross-coefficient (TCC) kernels, which are central to the efficient modeling of projection optical imaging systems in modern lithography.

According to some embodiments of the invention, a sampling matrix is formed from a random matrix, a pseudorandom matrix, or a structured matrix. A transmission cross-coefficient (TCC) matrix that mathematically describes the properties of an optical system is iteratively multiplied against the sampling matrix and the result is adaptively rescaled (or orthogonalized) until a convergence condition is met. As a result, a low-rank basis that approximately preserves the kernels of interest is formed according to a final result of the iterations or an accumulation of the intermediate results of the iterations. The low-rank basis is used to compute a reduced TCC matrix of smaller size.

With the reduced TCC matrix, a block algorithm is applied to compute an eigenvalue decomposition (EVD) or a singular value decomposition (SVD), from which the reduced TCC kernels are extracted and expanded to the full space. The reconstructed TCC kernels are applied for model calibration and mask correction/optimization so as to obtain an optimized mask.

Through the method, since the dominant computation includes only matrix multiplication, which includes $O(N^2)$ operations generally or even just $O(N \log N)$ in special cases, the computational complexity can be dramatically reduced and the lithography simulation for model-based mask making can be accelerated.

FIG. 1 is a schematic diagram illustrating a model simulation process according to an embodiment of the disclosure. Referring to FIG. 1, the model simulation of the embodiment is implemented to compute simulated images which are used, for example, to compare with actual images captured from the wafer to verify whether the simulated model is appropriate.

In step S110, a plurality of optical models 11 and a mask 12 are given as inputs for model simulation. Each of the optical models is, for example, a mathematical model comprising lots of parameters in association with the optics in a projection optical imaging system, such as defocus, image plane, wavelength of light, or numerical aperture. The mask is, for example, a lithographic photomask used in photolithography and developed with a pattern layer in integrated circuit fabrication.

In step S120, each of the optical models is applied to model simulation, which is implemented based on Hopkins theory. The Hopkins theory uses the transmission cross-coefficients (TCC) to describe the interference of mask transmission in contributing to the optical image which is formed by Fourier transforming the product of the TCC multiplied by the mask function.

In detail, the TCC for scalar optics may be presented as:

$$T(f,f')=\int P(f+f_s)S(f_s)P^*(f'+f_s)df_s,$$

where the independent variables are 2D spatial frequency coordinates, i.e., $f=(f_x, f_y)$. $P(f)$ is a pupil function equal to the Fourier transform of a point spread function. $S(f)$ is the source intensity distribution. The discretized $T(f, f')$ is a TCC matrix, in which one dimension is for $f$ and the other is for $f'$.

The TCC matrix T can also be written in a form as $T=PP^*\in\mathbb{C}^{N\times N}$, $P\in\mathbb{C}^{M\times N}$ (absorbing $\sqrt{S(f)}$ into each of P, $P^*$ since$\geq 0$), where P is the "stacked shifted pupil matrix" depending only on properties of the optical system (e.g., pupil function, source intensity, coherence factor, polarization) and $P^*$ is the conjugate transpose of pupil matrix P. In modern lithographic simulations, $M\cong 10^4$ and $N\cong 3000$. The TCC matrix T can be used to compute an aerial image AI as:

$$AI=\iint m(f)T(f,f')m^*(f')e^{2\pi i(f-f')}df\,df',$$

where $m(f)$ is a mask transmission function equal to a mask diffraction operator. It is noted that, from projection optics, the light diffracted by the pattern on the photomask enters the photoresist and an image of the photomask formed on the photoresist is called the aerial image.

The definition described above is for the scalar optical theory. A similar formula holds for the vector optical theory. That is, for a vector optical theory, $P(f)$ is changed to a matrix (i.e. multiple components to describe light polarization) and $S(f)$ is changed to a matrix so as to capture the polarization of each source point.

It follows that the TCC matrix T admits an eigendecomposition $T=V\Lambda V^*$, where V is unitary with columns $v_j$ and $\Lambda$ is diagonal with real entries $\lambda_1\geq\lambda_2\geq\ldots\geq 0$. The TCC kernels are the scaled eigenvectors $\varphi_j=\sqrt{\lambda_j}v_j$. Typically only some small number $k\ll N$ of leading kernels are retained, which then comprise an optimal approximation of T up to rank k.

Based on the above, in step S121, a plurality of TCC kernels are generated and in step S122, the generated TCC kernels are applied as part of the optical model.

The present embodiment focuses on the generation of TCC kernels in step S121.

Through iteratively multiplying the TCC matrix against a low-rank basis, a reduced TCC matrix is obtained and used to compute decomposition values. In the end, the TCC kernels can be generated by extracting reduced TCC kernels from the computed decomposition values and expanding the same to the full space.

In addition to applying the optical model, in step S130, a resist/wafer model is further applied to the model simulation such that a simulated image 13 is generated in step S140. The simulated image is used to compare with an actual image captured from the wafer so as to verify whether the simulated model is appropriate.

As a result, the model simulation process can run faster due to the reduced time for the generation of TCC kernels.

Figure 2:
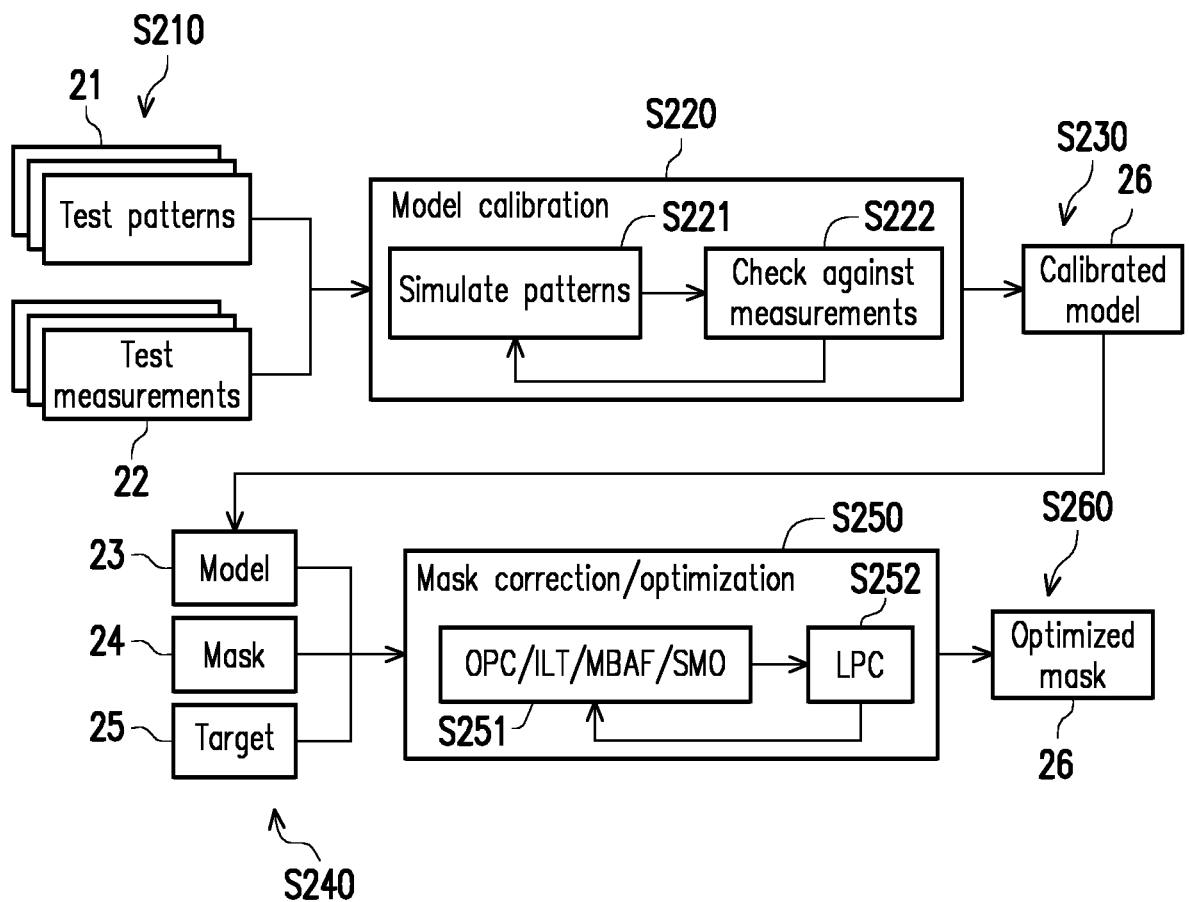
FIG. 2 is a schematic diagram illustrating a model-based mask making process according to an embodiment of the disclosure.

FIG. 2 is a schematic diagram illustrating a model-based mask making process according to an embodiment of the disclosure. Referring to FIG. 2, the mask making process is based on the model simulation as illustrated in FIG. 1.

In the upper half of FIG. 2, a model calibration approach for the qualification process of projection optics of wafer steppers and scanners is illustrated, in which a plurality of test patterns 21 are applied to make photomasks. The test patterns 21 are transferred from the photomasks to the photoresist formed on a substrate or a wafer by light, in which a series of chemical treatments are conducted to engrave the patterns into the material underneath the photoresist. A plurality of test measurements 22 are then obtained from the patterned substrate or wafer.

In step S210, the aforesaid test patterns 21 and test measurements 22 are given as inputs for model calibration. In the model calibration process in step S220, the model simulation process as illustrated in FIG. 1 is applied to simulate an optical model with the input test patterns (step S221), and the simulated measurements (i.e. simulated images) obtained from the model simulation are checked against the test measurements 22 to see whether the model is appropriate (step S222).

If the test measurements 22 and the simulated measurements are far from each other, it means the model is not robust and the process is returned back to step S221 to correct and change the model and perform the simulation again. The model calibration is performed repeatedly until the test measurements 22 and the simulated measurements are close to each other and accordingly a calibrated model 23 is outputted in step S230.

It is noted, every time the optical model is changed in step S221, the parameters of the optics are changed and accordingly the model simulation is performed again, which means new TCC kernels are desired to be computed and therefore the computation is a key factor that slows down the model calibration process.

In the lower half of FIG. 2, a mask correction/optimization process is illustrated, and in step S240, the model 23 calibrated in the previous model calibration process, a mask 24 and a target 25 are given as inputs to a plurality of simulations in the mask correction/optimization process in step S250. In the mask correction/optimization process, one or a combination of simulations including, but not limited to, optical proximity correction (OPC), inverse lithography technology (ILT), model-based assist feature (MBAF), and source-mask optimization (SMO) are performed in step S251 and a lithography process check (LPC) is performed in step S252 to check whether the mask made after correction/optimization is appropriate.

In some embodiments, if a result image obtained by using the given mask 24 is checked as not matching or similar to the target 25 (e.g. a desired pattern) in step S252, the simulations in steps S251 are performed again to correct the mask. On the other hand, if a result image obtained by using the given mask 24 is checked as matching or similar to the target 25 in step S252, an optimized mask 26 is output in step S260.

It is noted, although some of the simulations (e.g. OPC/ILT) in step S251 may apply the TCC kernels previously generated in step S220, some simulations may need new TCC kernels. For example, in some embodiments, for the simulation of source-mask optimization (SMO), since the optics are optimized in the simulation, the parameters of the optics are changed and new TCC kernels are desired to be computed. Similar to the simulation in step S221, the computation of new TCC kernels in step S251 may slow down the mask correction/optimization process and cause an overall time of mask making process to be increased.

In view of above, a method for computing feature kernels for optical model simulation is developed by the disclosure to accelerate the computation of TCC kernels, so as to reduce the time for model simulation process and mask making process.

Figure 3:
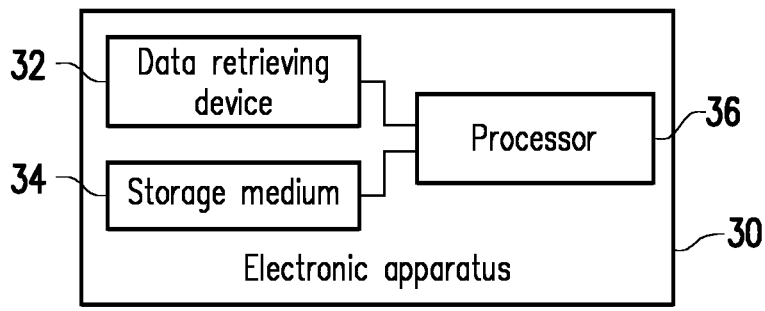
FIG. 3 illustrates a block diagram of an electronic apparatus for computing feature kernels for optical model simulation according to an embodiment of the disclosure.

In detail, FIG. 3 illustrates a block diagram of an electronic apparatus for computing feature kernels for optical model simulation according to an embodiment of the disclosure. Referring to FIG. 3, an electronic apparatus 30 of the present embodiment is, for example, a personal computer, a server, a work station or any other computing device, and may include a data retrieving device 32, a storage medium 34 and a processor 36 coupled to the data retrieving device 32 and the storage medium 34.

In some embodiments, the electronic apparatus 30 is externally connected to an optical imaging system (not shown) and configured to retrieve a plurality of properties of the optical imaging system and scan images obtained by the optical imaging system performing hot scans on a substrate or a wafer, so as to perform optical model simulation.

In some embodiments, the data retrieving device 32 is configured to connect the optical imaging system and retrieve the properties of the optical imaging system. The data retrieving device 32 is, for example, any wired or wireless interface such as USB, firewire, thunderbolt, universal asynchronous receiver/transmitter (UART), serial peripheral interface bus (SPI), WiFi, or Bluetooth, but the disclosure is not limited thereto.

The storage medium 34 is configured to store the properties retrieved by the data retrieving device 32. The storage medium 34 is, for example, a random access memory (RAM), a read-only memory (ROM), a flash memory, a hard disk, a redundant array of independent disks (RAID), other similar storage devices or a combination thereof, but the disclosure is not limited thereto.

The processor 36 is, for example, a central processing unit (CPU), other programmable general-purpose or specific-purpose microprocessors, a digital signal processor (DSP), a programmable controller, an application specific integrated circuit (ASIC), a programmable logic device (PLD), other similar devices, or a combination thereof, but the disclosure is not limited thereto.

Figure 4:
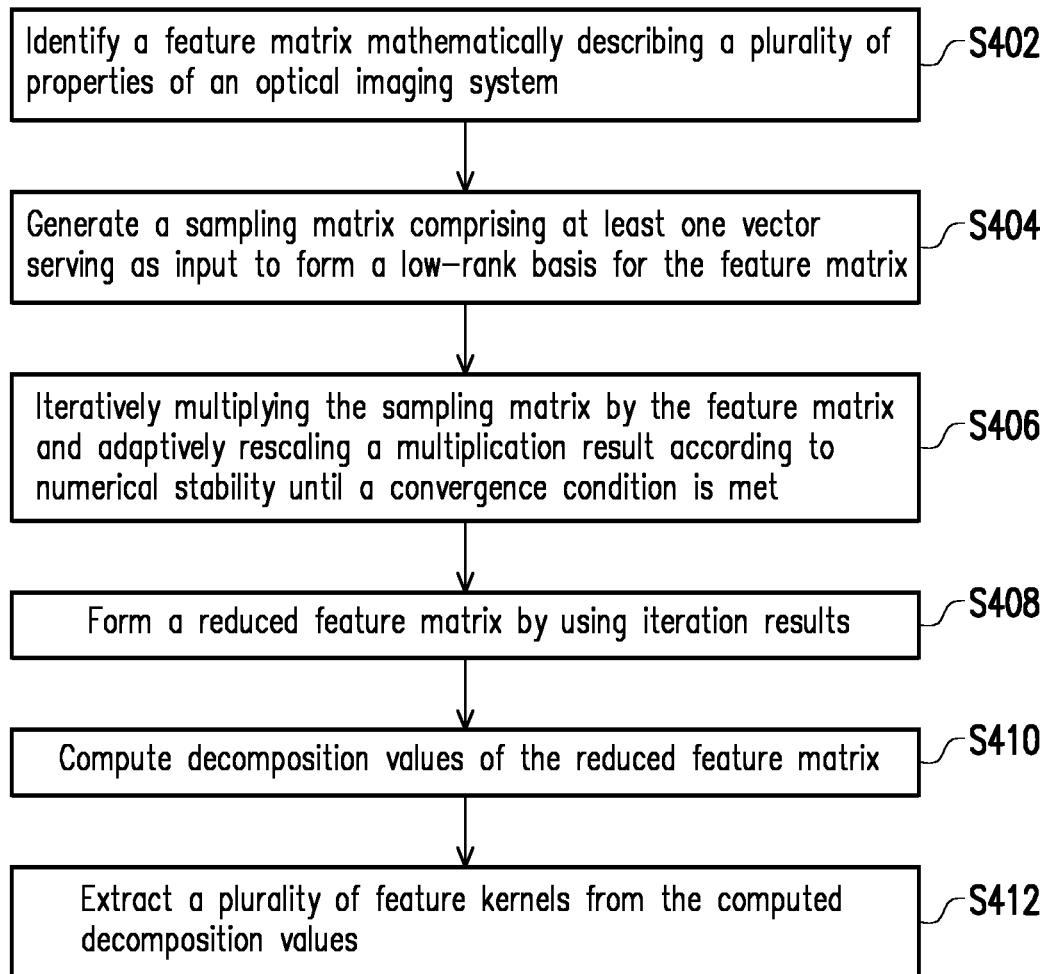
FIG. 4 is a flowchart illustrating a method for computing feature kernels for optical model simulation according to an embodiment of the disclosure.

The electronic apparatus 30 is configured to execute instructions for carrying out a method for computing feature kernels for optical model simulation in accordance with some embodiments of the present disclosure. In detail, FIG. 4 is a flowchart illustrating a method for computing feature kernels for optical model simulation according to an embodiment of the disclosure. The method of the present embodiment is adapted to the electronic apparatus 30 of FIG. 3, and detailed steps of the method are described below with reference to various components in the electronic apparatus 30 of FIG. 3.

Referring to FIG. 4, in step S402, the processor 36 identifies a feature matrix mathematically describing the plurality of properties of the optical imaging system. The feature matrix is, for example, a TCC matrix that mathematically describes the properties of an optical system such as pupil function, source intensity, coherence factor, or polarization, but the disclosure is not limited thereto.

In step S404, the processor 36 generates a sampling matrix comprising at least one vector serving as input to form a low-rank basis for the feature matrix. The sampling matrix comprises, for example, a random matrix, a pseudo-random matrix, or a structured matrix. In some embodiments, when generating the sampling matrix, the processor 36 may perform oversampling (e.g. enlarge rank k to k+O(1)) in order to improve random sampling error. In some embodiments, groups of vectors (i.e. matrices) are acted on simultaneously to exploit computer hardware cache efficiency, but in some embodiments, single-vector-at-a-time variants can also be derived, which can make the computation result more accurate.

In step S406, the processor 36 iteratively multiplies the sampling matrix by the feature matrix and adaptively rescales a multiplication result according to numerical stability until a convergence condition is met. The multiplication is repeatedly applied to improve spectral approximation error.

In some embodiments, the multiplication by the feature matrix is performed by exploiting a subset of the properties without directly computing the full feature matrix. For example, by performing the multiplication by the TCC matrix T as $Tx=P(P^*x)$, the calculation may bypass construction of T (includes $O(N^3)$ operations) and includes at most $O(N^2)$ operations, which gives an overall $O(N^2)$ cost for the algorithm. Other structures such as low-rank, sparse, or tensor may be further exploited, and the disclosure is not limited thereto.

In some embodiments, the multiplication by the feature matrix is performed by computing a convolution of a pupil matrix depending on the properties and a conjugate transpose of the pupil matrix using fast Fourier transform (FFT) when a plurality of source points are laid on a conformal uniform grid. The convolutional structure of the pupil matrix allows multiplication in $O(N \log N)$ time using FFT and gives an overall $O(N \log N)$ for the algorithm.

In some embodiments, the multiplication by the feature matrix is performed by computing a convolution of a pupil matrix depending on the properties and a conjugate transpose of the pupil matrix using FFT when a plurality of source points in an arbitrary distribution are resampled onto a uniform grid. The source points can be resampled onto the uniform grid with controllable aerial image error, and gives an overall $O(N \log N)$ for the algorithm as described above.

In some embodiments, the multiplication by the feature matrix is performed by computing a convolution of a pupil matrix depending on the properties and a conjugate transpose of the pupil matrix using non-uniform FFT when a plurality of source points in an arbitrary distribution are not on a uniform grid. Even for the source points in the arbitrary distribution, an overall $O(N \log N)$ for the algorithm can be achieved by using non-uniform FFT.

In some embodiments, in addition to explicitly considering the TCC matrix with a structure $T=PP^*$ which provides faster-than-$O(N^3)$ multiplication, TCC matrices with more general structures, e.g., $T=PDP^*$ for diagonal indefinite (i.e. can be negative) matrix D can also be applied.

In step S408, the processor 36 uses iteration results to form a reduced feature matrix.

In some embodiments, the reduced feature matrix is obtained through subspace iteration, which is used to compute a low-rank basis approximating the leading eigenspace. Convergence can be tied to performing a fixed number of iterations or to monitoring some metric of subspace similarity. That is, in some embodiments, the convergence condition is determined to be met when a number of iterations reaches a predetermined number while in some embodiments, the convergence condition is determined to be met when an adaptive error metric is monitored, but the disclosure is not limited thereto. Accordingly, the reduced feature matrix is formed by using a final result of the iterations.

In some embodiments, the reduced feature matrix is obtained through a block Krylov method, in which intermediate results are better used to construct a possibly larger basis than the subspace iteration, in a fashion similar to the classical Lanczos method. That is, the reduced feature matrix is formed by initiating an empty basis and accumulating an intermediate result of each iteration to the empty basis. Compared to the subspace iteration, the approximation error is strictly no worse, but the price is that the reduced feature matrix may be larger and the cost for calculating the decomposition values may be higher.

In step S410, the processor 36 computes decomposition values of the reduced feature matrix and in step S412, the processor 36 extracts a plurality of feature kernels from the computed decomposition values. In some embodiments, the decomposition values of the reduced feature matrix are computed by using a block algorithm such as an eigenvalue decomposition (EVD) algorithm or a singular value decomposition (SVD) algorithm, which are respectively illustrated in detail below.

FIG. 5A is a flowchart illustrating a method for computing feature kernels for optical model simulation by using EVD algorithm according to an embodiment of the disclosure. FIG. 5B is a schematic diagram illustrating an example of computing feature kernels for optical model simulation by using EVD algorithm according to an embodiment of the disclosure. The method of the present embodiment is adapted to the electronic apparatus 30 of FIG. 3, and detailed steps of the method are described below with reference to various components in the electronic apparatus 30 of FIG. 3.

Referring to both FIG. 5A and FIG. 5B, in step S502, the processor 36 obtains a pupil matrix of the optical system, so as to calculate a TCC matrix T that mathematically describes the properties of the optical system.

In step S504, borrowing techniques from randomized numerical linear algebra, the processor 36 finds a low-rank basis Q of size O(k) that approximately preserves kernels of interest.

In step S506, the processor 36 multiplies the low-rank basis Q by the TCC matrix T to form a reduced TCC matrix $\tilde{T}$, in which a conjugate transpose matrix Q* of the low-rank basis Q is multiplied by the TCC matrix T and the low-rank basis Q so as to compress the TCC matrix T into the reduced TCC matrix $\tilde{T}$.

In step S508, the processor 36 computes a reduced EVD from the reduced TCC matrix $\tilde{T}$.

In step S510, the processor 36 extracts kernels from the computed reduced EVD. In some embodiments, the processor 36 extracts reduced TCC kernels (i.e. $\tilde{V}\sqrt{\tilde{\Lambda}}$) from the computed reduced EVD and then expands the extracted reduced TCC kernels to the full space by multiplying the low-rank basis Q with the reduced TCC kernels so as to recover the TCC kernels (i.e. $Q\tilde{V}\sqrt{\tilde{\Lambda}}$).

According to the present embodiment, the low-rank basis is found and used to compress the TCC matrix into a small reduced matrix (e.g. a TCC matrix with a size of order k by order k, where k is the number of kernels of interest). The computation is performed in the small, compressed space and the results are expanded back to the original space. As a result, the computational complexity can be dramatically reduced and the generation of TCC kernels can be accelerated.

In some embodiments, the method for finding the low-rank basis may be performed through subspace iteration or block Krylov method as introduced above.

Figure 6A:
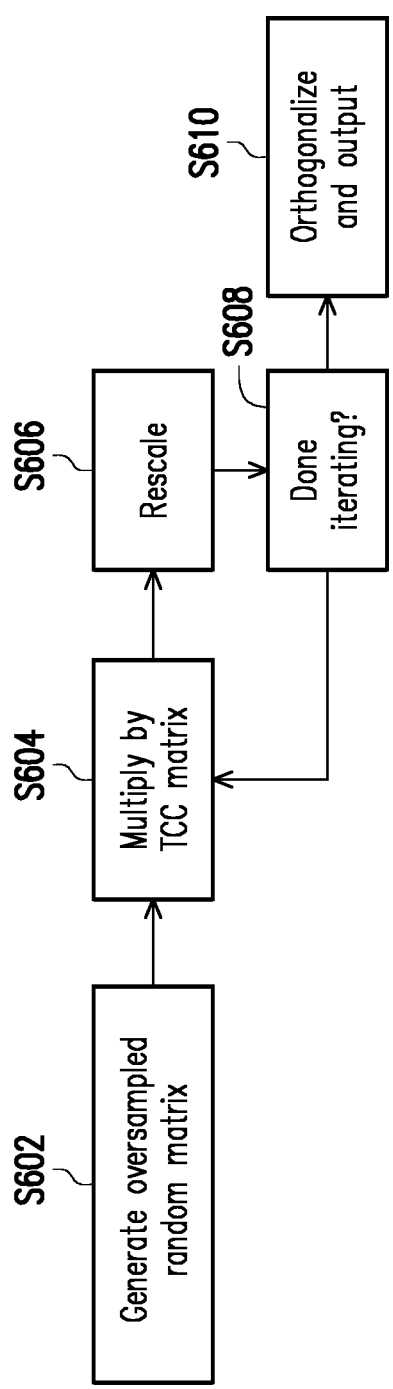
FIG. 6A is a flowchart illustrating a method for finding a low-rank basis through subspace iteration according to an embodiment of the disclosure.
Figure 6B:
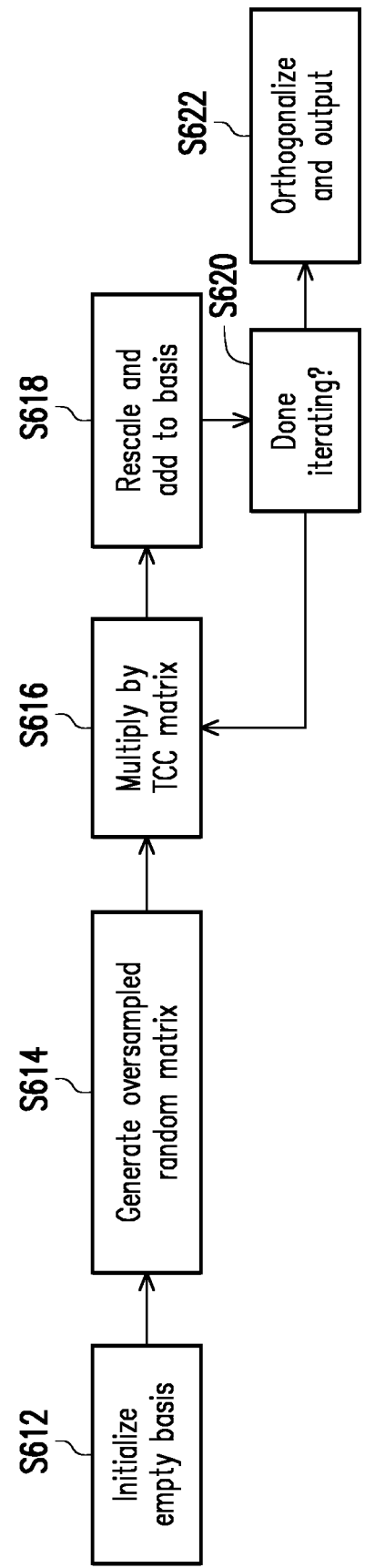
FIG. 6B is a flowchart illustrating a method for finding a low-rank basis through the block Krylov method according to an embodiment of the disclosure.

In detail, FIG. 6A is a flowchart illustrating a method for finding a low-rank basis through subspace iteration according to an embodiment of the disclosure. FIG. 6B is a flowchart illustrating a method for finding a low-rank basis through the block Krylov method according to an embodiment of the disclosure. The methods of the present embodiments are adapted to the electronic apparatus 30 of FIG. 3.

Referring to FIG. 6A, in step S602, the processor 36 generates an oversampled random matrix. In some embodiments, the processor 36 may generate the oversampled random matrix by oversampling a random matrix, a pseudorandom matrix, or a structured matrix.

In step S604, the processor 36 multiplies the generated random matrix by the TCC matrix and in step 606, adaptively rescales a multiplication result according to numerical stability. The rescaling is referred to as, for example, Gram-Schmidt orthogonalization, primarily for the numerical stability, but the disclosure is not limited thereto.

In step S608, the processor 36 determines whether the iteration is done. In some embodiments, the termination (i.e. convergence) can be fixed based on a set number of iterations or some adaptive error metric.

If the convergence condition is not met, the processor 36 returns to step S606 to iteratively multiply the generated random matrix by the TCC matrix and rescales the multiplication result again until the convergence condition is met. Once the convergence condition is met, the processor 36 proceeds to step S610 to orthogonalize the rescaled multiplication result and finally output the orthogonalized result as the low-rank basis.

Referring to FIG. 6B, in step S612, the processor 36 initializes an empty basis and then in step S614 generates an oversampled random matrix. In some embodiments, the processor 36 may generate the oversampled random matrix by oversampling a random matrix, a pseudorandom matrix, or a structured matrix.

In step S616, the processor 36 multiplies the generated random matrix by the TCC matrix and in step 618, adaptively rescales a multiplication result according to numerical stability and adds the rescaled multiplication result to the empty basis initialized in step S612. The rescaling is referred to as, for example, Gram-Schmidt orthogonalization, primarily for the numerical stability, but the disclosure is not limited thereto.

In step S620, the processor 36 determines whether the iteration is done. In some embodiments, the termination (i.e. convergence) can be fixed based on a set number of iterations or some adaptive error metric.

If the convergence condition is not met, the processor 36 returns to step S616 to iteratively multiply the generated random matrix by the TCC matrix, rescales the multiplication result, and adds the rescaled multiplication to the accumulated basis until the convergence condition is met. Once the convergence condition is met, the processor 36 proceeds to step S622 to orthogonalize the accumulated basis and finally output the orthogonalized basis as the low-rank basis.

Compared to the subspace iteration, as for the block Krylov method, the intermediate results are accumulated to construct a possibly larger basis than the subspace iteration. As a result, the approximation error is strictly no worse, but the cost for computing the EVD may be more expensive since the generated basis is larger.

In aforesaid method illustrated in FIG. 5A to FIG. 6B, the feature kernels are computed using the EVD algorithm. However, in some embodiments, the feature kernels can be computed using the SVD algorithm. Embodiments are given below for further illustration.

FIG. 7A is a flowchart illustrating a method for computing feature kernels for optical model simulation by using SVD algorithm according to an embodiment of the disclosure. FIG. 7B is a schematic diagram illustrating an example of computing feature kernels for optical model simulation by using SVD algorithm according to an embodiment of the disclosure. The method of the present embodiment is adapted to the electronic apparatus 30 of FIG. 3, and detailed steps of the method are described below with reference to various components in the electronic apparatus 30 of FIG. 3.

Referring to both FIG. 7A and FIG. 7B, in step S702, the processor 36 obtains a pupil matrix P of the optical system.

In step S704, borrowing techniques from randomized numerical linear algebra, the processor 36 finds a low-rank basis Q of size O(k) that approximately preserves kernels of interest.

In step S706, the processor 36 multiplies a conjugate transpose matrix Q* of the low-rank basis Q by the pupil matrix P to form a reduced pupil matrix $\tilde{P}$, so as to compress the pupil matrix P into the reduced pupil matrix $\tilde{P}$.

In step S708, the processor 36 computes a reduced SVD from the reduced pupil matrix $\tilde{P}$. For a reduced TCC matrix with eigendecomposition $\tilde{T}=\tilde{V}\Lambda\tilde{V}$, the corresponding reduced pupil matrix SVD is $\tilde{P}=\tilde{V}\sqrt{\tilde{\Lambda}}\tilde{W}$, for some unitary matrix $\tilde{W}$.

In step S710, the processor 36 extracts kernels from the computed reduced SVD. In some embodiments, the processor 36 extracts reduced TCC kernels (i.e. $\tilde{V}\sqrt{\tilde{\Lambda}}$) from the computed reduced SVD and then expands the extracted reduced TCC kernels to the full space by multiplying the low-rank basis Q with the reduced TCC kernels so as to recover the TCC kernels (i.e. $Q\tilde{V}\sqrt{\tilde{\Lambda}}$).

In some embodiments, the method for finding the low-rank basis may be performed through subspace iteration or block Krylov method as introduced above.

In detail, in some embodiments, the reduced feature matrix may be obtained through subspace iteration, which is used to compute a low-rank basis approximating the leading eigenspace. Convergence can be tied to performing a fixed number of iterations or to monitoring some metric of subspace similarity. Accordingly, the low-rank basis can be found by iteratively multiplying the generated random matrix by the TCC matrix (i.e., by the pupil matrix and its conjugate transpose), rescaling the multiplication result, and orthogonalizing the rescaled multiplication result.

In some embodiments, the reduced feature matrix may be obtained through a block Krylov method, in which intermediate results are better used to construct a possibly larger basis than the subspace iteration. Accordingly, the low-rank basis can be found by initiating an empty basis, accumulating an intermediate result of each iteration to the empty basis, and orthogonalizing the accumulated basis.

In the fast low-rank SVD algorithm for pupil matrix P of the present embodiment, since the spectral decay for the pupil matrix P is only half that for TCC matrix T, the error, which depends on spectral decay, may be larger.

In the embodiments described above, a fast EVD-based algorithm and a fast SVD-based algorithm are respectively introduced to extract the TCC kernels, but in some embodiments, the same ideas may also be used to generate various fast low-rank factorizations beyond the classical decompositions, resulting in "non-canonical" TCC kernels with, e.g., reduced memory complexity.

In some embodiments, a non-transitory computer-readable recording medium comprising processor executable instructions that when executed perform a method for computing feature kernels for optical model simulation as illustrated in the embodiments above is provided. In some embodiments, the non-transitory computer-readable recording medium is a CD-R, a DVD-R, a flash drive, or a platter of a hard disk drive, etc., on which is encoded computer-readable data. The computer-readable data, such as binary data comprising a plurality of zeros and ones, in turn comprises a set of computer instructions configured to operate according to one or more of the principles set forth herein. In some embodiments, the processor-executable computer instructions are configured to perform a method for computing feature kernels for optical model simulation, such as at least some of the exemplary method illustrated in FIG. 4, for example. Many such computer-readable recording media are devised by those of ordinary skill in the art that are configured to operate in accordance with the techniques presented herein.

According to some embodiments, a method for computing feature kernels for optical model simulation, adapted to an electronic apparatus having a storage medium and a processor, is provided. In the method, a feature matrix mathematically describing a plurality of properties of an optical imaging system retrieved from the optical imaging system and stored in the storage medium is identified by the processor. A sampling matrix comprising at least one vector serving as input to form a low-rank basis for the feature matrix is generated by the processor. The sampling matrix is iteratively multiplied by the feature matrix and a multiplication result is adaptively rescaled according to numerical stability by the processor until a convergence condition is met. The iteration results are used by the processor to form a reduced feature matrix. Decomposition values of the reduced feature matrix are computed and a plurality of feature kernels are extracted from the computed decomposition values by the processor.

According to some embodiments, an apparatus for computing feature kernels for optical model simulation includes a data retrieving device, a storage medium and a processor. The data retrieving device is configured to retrieve a plurality of properties of an optical imaging system. The storage medium is configured to store the properties retrieved by the data retrieving device. The processor is coupled to the data retrieving device and the storage medium, and configured to execute instructions to identify a feature matrix mathematically describing the plurality of properties of the optical imaging system, generate a sampling matrix comprising at least one vector serving as input to form a low-rank basis for the feature matrix, iteratively multiply the sampling matrix by the feature matrix and adaptively rescale a multiplication result according to numerical stability until a convergence condition is met, use iteration results to form a reduced feature matrix, and compute decomposition values of the reduced feature matrix and extract a plurality of feature kernels from the computed decomposition values.

According to some embodiments, a non-transitory computer-readable recording medium includes processor executable instructions that when executed perform a method for computing feature kernels for optical model simulation. In the method, a feature matrix mathematically describing a plurality of properties of an optical imaging system is identified. A sampling matrix comprising at least one vector serving as input to form a low-rank basis for the feature matrix is generated. The sampling matrix is iteratively multiplied by the feature matrix and a multiplication result is adaptively rescaled according to numerical stability until a convergence condition is met. The iteration results are used to form a reduced feature matrix. Decomposition values of the reduced feature matrix are computed and a plurality of feature kernels are extracted from the computed decomposition values.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for computing feature kernels for optical model simulation, adapted to an electronic apparatus having a storage medium and a processor, the method comprising:
    identifying a feature matrix mathematically describing a plurality of properties of an optical imaging system retrieved from the optical imaging system and stored in the storage medium by the processor;
    generating a sampling matrix comprising at least one vector serving as input to form a low-rank basis for the feature matrix by the processor;
    multiplying the sampling matrix by the feature matrix to obtain a multiplication result and adaptively rescaling the multiplication result according to numerical stability of the multiplication result by the processor, and iteratively multiplying the rescaled multiplication result by the feature matrix to obtain a multiplication result of a current iteration and rescaling the multiplication result until a convergence condition is met;
    using the rescaled multiplication results to form a reduced feature matrix by the processor; and
    computing decomposition values of the reduced feature matrix and extracting a plurality of feature kernels from the computed decomposition values by the processor.

2. The method according to claim 1, wherein the reduced feature matrix is formed by a final result of the iterations.

3. The method according to claim 1, wherein the reduced feature matrix is formed by initiating an empty basis and accumulating an intermediate result of each iteration to the empty basis.

4. The method according to claim 1, wherein the sampling matrix comprises a random matrix, a pseudorandom matrix, or a structured matrix, and the step of generating the sampling matrix further comprises:
    performing oversampling to improve random sampling error.

5. The method according to claim 1, wherein the convergence condition is met when a number of iterations reaches a predetermined number or an adaptive error metric is monitored.

6. The method according to claim 1, wherein the multiplication by the feature matrix is performed by exploiting a subset of the properties without directly computing the full feature matrix.

7. The method according to claim 1, wherein the multiplication by the feature matrix is performed by computing a convolution of a pupil matrix depending on the properties and a conjugate transpose of the pupil matrix using fast Fourier transform (FFT) when a plurality of source points are laid on a conformal uniform grid.

8. The method according to claim 1, wherein the multiplication by the feature matrix is performed by computing a convolution of a pupil matrix depending on the properties and a conjugate transpose of the pupil matrix using FFT when a plurality of source points in an arbitrary distribution are resampled onto a uniform grid.

9. The method according to claim 1, wherein the multiplication by the feature matrix is performed by computing a convolution of a pupil matrix depending on the properties and a conjugate transpose of the pupil matrix using the non-uniform FFT when a plurality of source points in an arbitrary distribution are not on a uniform grid.

10. The method according to claim 1, wherein the step of computing decomposition values of the reduced feature matrix comprises:
    computing the decomposition values of the reduced feature matrix by using a block algorithm comprising an eigenvalue decomposition (EVD) algorithm or a singular value decomposition (SVD) algorithm.

11. An apparatus for computing feature kernels for optical model simulation, comprising:
    a data retrieving device, configured to retrieve a plurality of properties of an optical imaging system;
    a storage medium, configured to store the properties retrieved by the data retrieving device;
    a processor, coupled to the data retrieving device and the storage medium, and configured to execute instructions to perform steps of:
    identifying a feature matrix mathematically describing the plurality of properties of the optical imaging system;
    generating a sampling matrix comprising at least one vector serving as input to form a low-rank basis for the feature matrix;
    multiplying the sampling matrix by the feature matrix to obtain a multiplication result and adaptively rescaling the multiplication result according to numerical stability of the multiplication result by the processor, and iteratively multiplying the rescaled multiplication result by the feature matrix to obtain a multiplication result of a current iteration and rescaling the multiplication result until a convergence condition is met;
    using the rescaled multiplication results to form a reduced feature matrix by the processor; and
    computing decomposition values of the reduced feature matrix and extracting a plurality of feature kernels from the computed decomposition values.

12. The apparatus for computing feature kernels for optical model simulation according to claim 11, wherein the reduced feature matrix is formed by a final result of the iterations.

13. The apparatus for computing feature kernels for optical model simulation according to claim 11, wherein the reduced feature matrix is formed by initiating an empty basis and accumulating an intermediate result of each iteration to the empty basis.

14. The apparatus for computing feature kernels for optical model simulation according to claim 11, wherein the sampling matrix comprises a random matrix, a pseudorandom matrix, or a structured matrix, and the processor further performs oversampling to improve random sampling error.

15. The apparatus for computing feature kernels for optical model simulation according to claim 11, wherein the convergence condition is met when a number of iterations reaches a predetermined number or an adaptive error metric is monitored.

16. The apparatus for computing feature kernels for optical model simulation according to claim 11, wherein the multiplication by the feature matrix is performed by the processor exploiting a subset of the properties without directly computing the full feature matrix.

17. The apparatus for computing feature kernels for optical model simulation according to claim 11, wherein the multiplication by the feature matrix is performed by the processor computing a convolution of a pupil matrix depending on the properties and a conjugate transpose of the pupil matrix using FFT when a plurality of source points are laid on a conformal uniform grid.

18. The apparatus for computing feature kernels for optical model simulation according to claim 11, wherein the multiplication by the feature matrix is performed by the processor computing a convolution of a pupil matrix depending on the properties and a conjugate transpose of the pupil matrix using FFT when a plurality of source points in an arbitrary distribution are resampled onto a conformal uniform grid.

19. The apparatus for computing feature kernels for optical model simulation according to claim 11, wherein the multiplication by the feature matrix is performed by the processor computing a convolution of a pupil matrix depending on the properties and a conjugate transpose of the pupil matrix using non-uniform FFT when a plurality of source points in an arbitrary distribution are not on a uniform grid.

20. A non-transitory computer-readable recording medium comprising processor executable instructions that when executed perform a method for computing feature kernels for optical model simulation, the method comprising:
 identifying a feature matrix mathematically describing a plurality of properties of an optical imaging system;
 generating a sampling matrix comprising at least one vector serving as input to form a low-rank basis for the feature matrix;
 multiplying the sampling matrix by the feature matrix to obtain a multiplication result and adaptively rescaling the multiplication result according to numerical stability of the multiplication result by the processor, and iteratively multiplying the rescaled multiplication result by the feature matrix to obtain a multiplication result of a current iteration and rescaling the multiplication result until a convergence condition is met;
 using the rescaled multiplication results to form a reduced feature matrix by the processor; and
 computing decomposition values of the reduced feature matrix and extracting a plurality of feature kernels from the computed decomposition values.

\* \* \* \* \*